United States Patent [19]
Schenck

[11] Patent Number: 5,561,371
[45] Date of Patent: Oct. 1, 1996

[54] TRANSVERSE GRADIENT COIL

[75] Inventor: John F. Schenck, Schenectady, N.Y.

[73] Assignee: General Electric Company, Schenectady, N.Y.

[21] Appl. No.: 534,425

[22] Filed: Sep. 27, 1995

[51] Int. Cl.$^6$ .................................. G01R 33/20
[52] U.S. Cl. ........................... 324/318; 324/322
[58] Field of Search .................... 324/300, 307, 324/309, 310, 311, 312, 313, 314, 318, 322

[56] References Cited

U.S. PATENT DOCUMENTS

5,177,442   1/1993   Roemer ................................ 324/318

Primary Examiner—Michael Tokar
Attorney, Agent, or Firm—Lawrence P. Zale; Marvin Snyder

[57] ABSTRACT

Magnetic field gradient coils, such as those typically employed in magnetic resonance (MR) imaging employ folded loop current paths in which a first section carries current along a path close to an imaging volume. This produces a magnetic field gradient within the imaging volume. A second section, being a further radial distance from the imaging volume, carries current in a return path, in a substantially opposite current direction as the first section, thereby reducing stray magnetic fields outside of the second section. The second preferable has the same current pattern, but is slightly larger to contain magnetic fields at the fringes. A third section connects each turn of the coils in the first section to a corresponding turn of coils in the second section. This third section is disposed in a partially radial direction to connect the first and second sections. The present invention employs the return current, which is typically wasted current, to 'shield' the gradient coils, reducing stray magnetic fields outside of the gradient coils, and therefore replace a second layer of 'shielding' coils typically used in conventional systems. This results in a great power savings, and increased ability to rapidly change magnetic field gradients, while reducing claustrophobia, acoustic noise and a possibility of nerve stimulation.

5 Claims, 6 Drawing Sheets

TRANSVERSE GRADIENT COIL

BACKGROUND OF THE INVENTION

1. Field of the Invention

This invention relates to magnetic resonance imaging systems.

2. Description of the Related Art

In order to perform magnetic resonant imaging, it is necessary to provide a magnetic field gradient in spatial directions to encode locations of the sources of a magnetic resonance (MR) response signal. This encoded MR response signal is used to create the MR images. In conventional MR imaging systems there is a set of gradient coils through which current flows to produce a magnetic field which either adds or subtracts to a static magnetic field provided by a main magnet.

In order to create a magnetic field gradient, required for MR imaging, current must be provided over a surface with a specified current density. Since current requires a closed loop, there is a return loop which typically provides a magnetic field which is not the same as the desired magnetic field gradient. Typically the return loop distorts and weakens the desired gradient magnetic field.

The magnetic field gradient is intended to be created within an imaging volume inside the MR imaging apparatus. Stray magnetic fields which are produced outside of the imaging volume by the currents in the gradient coil can induce stray currents, known as eddy currents, in electrically conducting support structures in the magnet. The eddy currents produce additional and undesirable gradient fields within the imaging region. It is, therefore, desirable to contain the stray magnetic fields in order to restrict their ability to induce eddy currents.

One method of containing the stray magnetic fields is to provide a second layer of coils outside, and surrounding, the first layer of coils used to produce the magnetic field gradients. This second layer of coils produces a magnetic field of opposite polarity compared to that of the first layer, and neutralizes most of the magnetic field produced by the first layer of coils outside of the imaging volume. This requires driving current through an additional layer of coils. The power required to drive a current through coils is related to the strength of the desired gradient magnetic fields necessary to carry out a prescribed imaging process. Since large changes in current are desired to be applied over very short time periods, the power required can become very large. This, combined with the fact that there is a second layer of coils to drive, results in a large power requirement of the MR imaging apparatus.

Since the speed of the MR imaging, and the quality of the imaging data, is related to how quickly the current can be changed within the gradient coils, a two layer, or shielded, gradient coil design is inherently slower than the single layer design using the same coils.

The need for a return current makes the gradient coils longer, thereby causing some patients to become uncomfortable and claustrophobic when placed inside the imaging system.

Currently there is a need for an MR imaging system which contains stray magnetic gradient fields, also is faster for a given gradient amplifier power, and is not as confining as conventional magnetic resonance imaging systems.

OBJECTS OF THE INVENTION

An object of the present invention is to provide a device for providing desired magnetic field gradients more quickly than conventional devices for the same gradient amplifier power.

Another object of the present invention is to provide a device which requires lower gradient amplifier power to produce images at the same speed as conventional MR imaging devices.

Another object of the present invention is to provide a magnetic resonance imaging device with a more open imaging region, thereby reducing the 'claustrophobic' effect on patients being imaged.

Another object of the present invention is to provide a magnetic resonance imaging device which produces less acoustic noise as compared with conventional magnetic resonance imaging systems.

Another object of the present invention is to provide a magnetic resonance imaging device which reduces the portion of the patient exposed to large magnetic field gradients to reduce the possibility of nerve stimulation.

SUMMARY OF THE INVENTION

A coil for use in a magnetic field gradient system has a first surface partially enclosing an imaging volume. The first surface has a plurality of adjacent conductor half-loops each for carrying a current.

A second surface arranged substantially parallel to the first surface outside of the first surface, with respect to the imaging volume. A second surface also having a plurality of adjacent conductor half-loops for carrying a current. The conductors of the second surface substantially mirror those of the first surface.

A plurality of connecting conductors, connect each half-loop of the first surface to a corresponding half-loop of the second surface such that a continuous coil is produces from the half-loops. A current is passed through conductors of the first and second surfaces thereby flowing in opposite directions at different distances from the imaging volume.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION OF THE INVENTION

Figure 1:
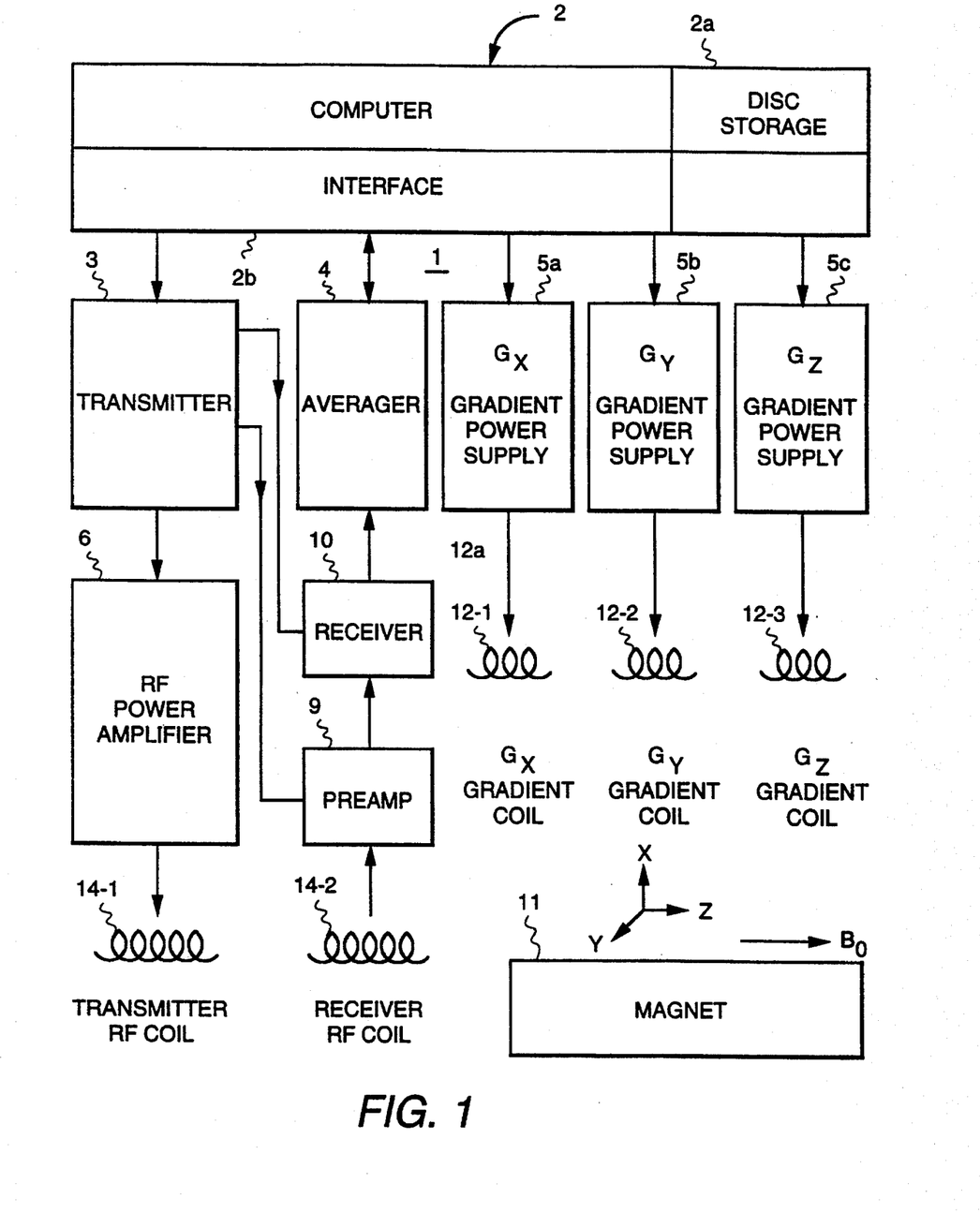
FIG. 1 is a simplified block diagram of a magnetic resonance imaging device in which the present invention may be utilized.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, respectively, in the "X", "Y", "Z" directions, respectively, over a subject 10 desired to be imaged. RF transmitter 3 is gated with pulse envelopes from computer 2 to generate RF pulses having the required modulation to excite an MR response signal from subject 10. The RF pulses are amplified in an RF power amplifier 6 to levels varying from 100 watts to several kilowatts, depending on the imaging method, and applied to an RF transmitter coil 14-1. The higher power levels are necessary for large sample volumes, such as in whole body imaging, and where short duration pulses are required to excite larger MR frequency bandwidths.

MR response signals are sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the s scope of the present invention).

RF transmitter coil 14-1 and receiver coil, 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

Magnetic field gradient coils 12-1, 12-2, and 12-3 are necessary to provide gradients $G_x$, $G_y$, and $G_z$, respectively, that are monotonic and linear over the sample volume. Multivalued gradient fields cause a degradation in the MR response signal data, known as aliasing, which leads to severe image artifacts. Nonlinear gradients cause geometric distortions of the image.

Figure 2:
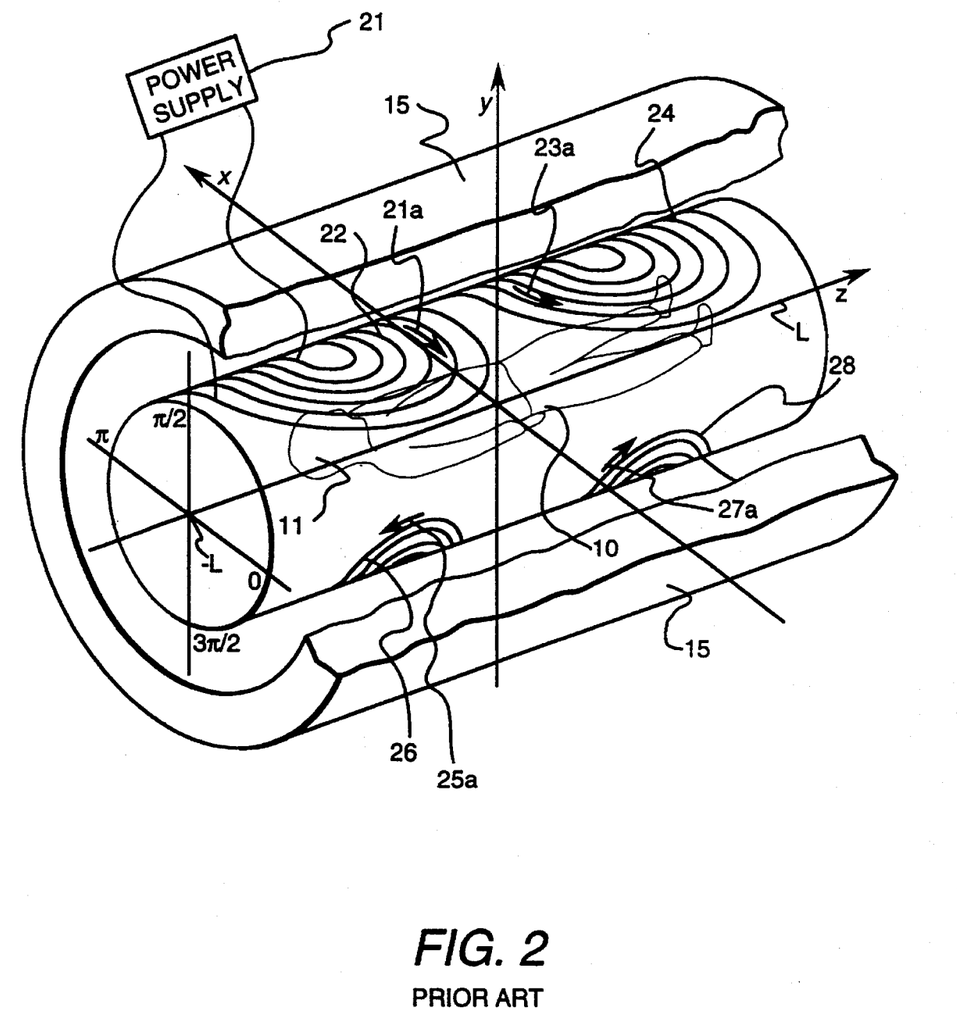
FIG. 2 is an illustration of a patient positioned within a conventional transverse gradient body coil and main magnet of an MR imaging system.

A conventional MR imaging transverse gradient magnetic field body coil, 12-1, 12-2 of FIG. 1, is shown in FIG. 2. It typically has four quadrants each which have a 'fingerprint' winding pattern 22, 24, 26, 28, similar to that shown in FIG. 3. Current flows according to, or opposite arrows 21a, 23a, 25a, 27a. These quadrants are electrically connected in series with each other.

Figure 3:
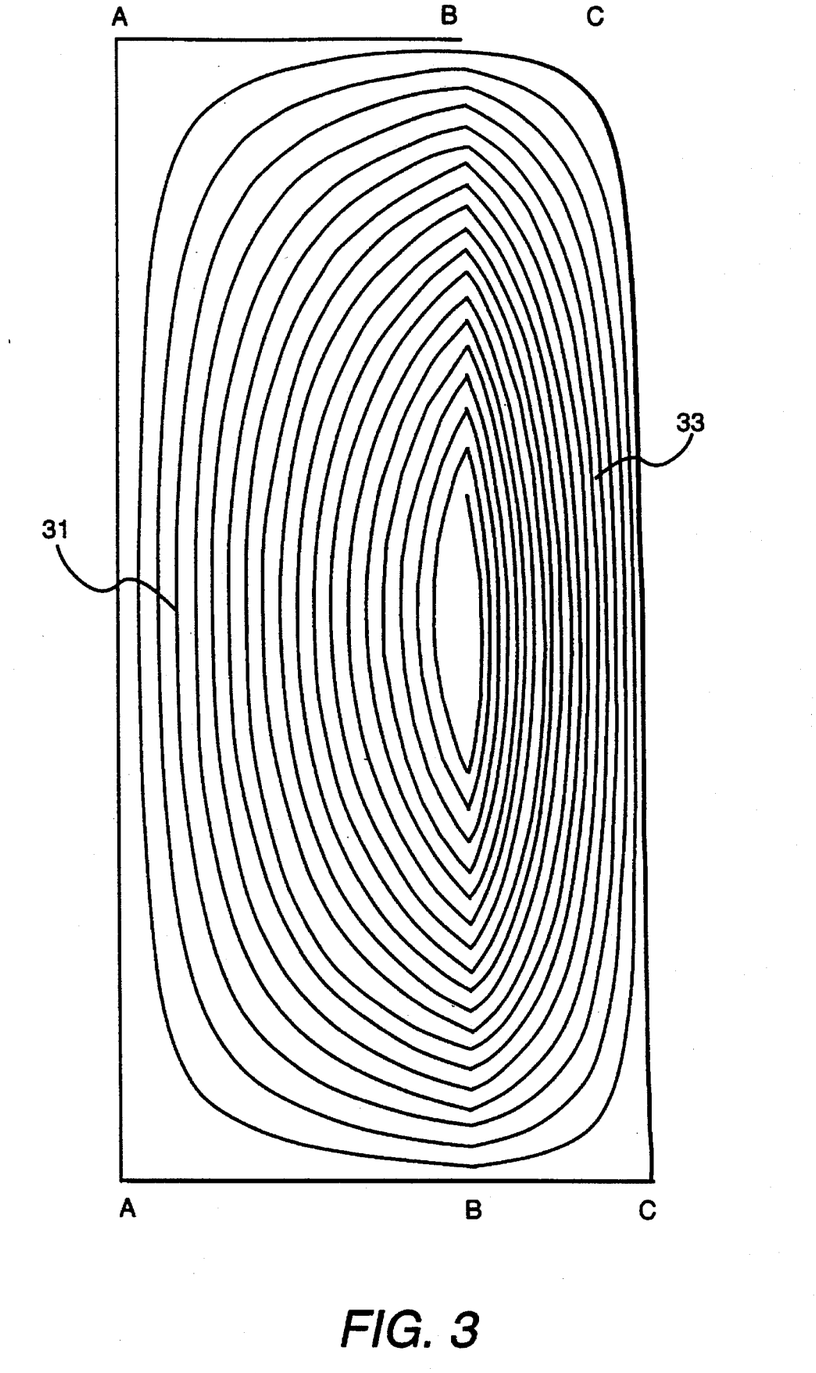
FIG. 3 is an illustration of a one of the 'fingerprint' coils of the transverse magnetic field gradient body coil of FIG. 2.

In each of the 'fingerprint' coils of FIG. 3, a surface current is designed to pass through a region 31 from A to B to cause a magnetic field to be produced. This current path is designed to provide the desired magnetic field gradient. The region 33 from B to C is necessary to provide a current return path, completing the circuit. The return path in region 33, however, increases the energy stored in the magnetic field produced without providing a useful imaging gradient.

Figure 4:
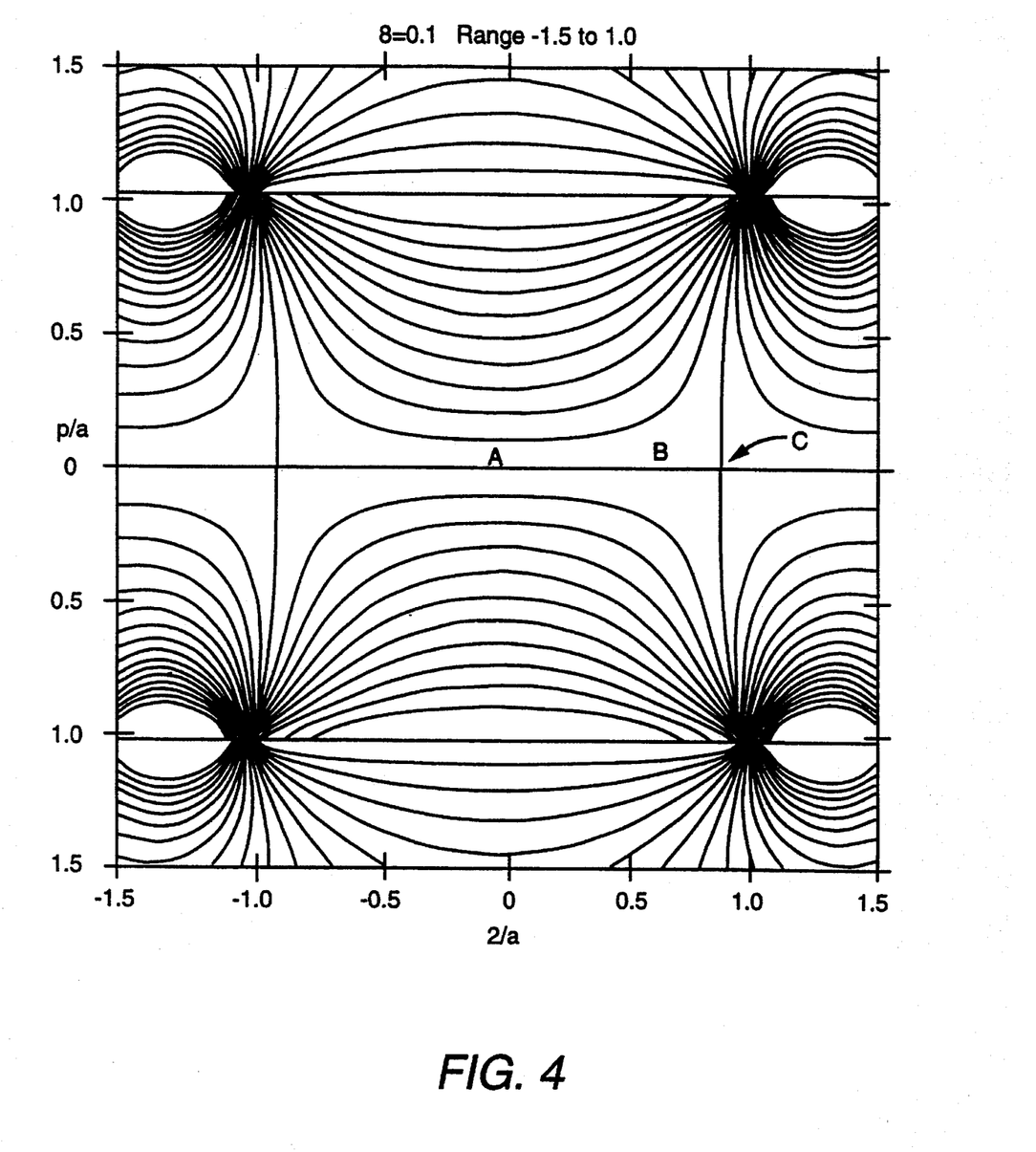
FIG. 4 is an illustration of magnetic field lines of flux produced by the transverse magnetic field gradient body coil of FIG. 2.

FIG. 4 shows the lines of constant magnetic field component parallel to the main magnetic field for a steady current passing through the coils of the body coil of FIG. 2, and winding pattern of FIG. 3. Points A, B and C of FIG. 4 corresponding to A, B and C of FIG. 3. As is evident in FIG. 4, the gradient field produced by the return current path reduces the applied magnetic field gradient to zero at point C and actually reverses the gradient to the right of point C. Therefore, although the gradient is quite linear at the point A, it is reduced to an unusable level at point B and is, in fact, reversed beyond point C.

Since the magnetic field produced extends both into the cylinder and also outside of the cylinder, stray magnetic fields affect nearby equipment and objects. These magnetic fields are rapidly turned on and off, causing a time-changing magnetic field disturbance. It is therefore common to try to contain the stray magnetic fields.

A double layer gradient coil design is usually employed to contain stray magnetic fields outside of the gradient coils. By adding a second cylinder of radius $a_2$ outside the inner cylinder of radius $a_1$ having a similar 'fingerprint' coils, but having the current in each 'fingerprint' coil running opposite that of a corresponding coil on the inner cylinder. The outer coils create a magnetic field gradient of opposite polarity as that produced by the inner gradient coil. This reduces the magnetic gradient field produced outside of the cylinders, but also reduces the field inside of the inner cylinder, which is the imaging volume, reducing the efficiency of the inner gradient coils.

Since the magnitude of a magnetic field created is inversely proportional to the radial distance from the current-carrying element, the effect of the inner cylinder on the imaging volume is significantly greater than that of the outer cylinder:

The magnetic field produced by a gradient coil is given by the Biot-Savart Law:

$$B = \frac{\mu_0}{4\pi} \oint_{coil} \frac{\vec{\lambda} \times \hat{r}}{R^2} \, dA \tag{1}$$

where:

$\mu_0$ is the magnetic field permeability in free space, dA is an incremental current carrying element, $\vec{\lambda}$ is the current density in the incremental current-carrying element dA;

$\hat{r}$ is a unit vector pointing in the direction from the incremental current carrying member to a point where the magnetic field is desired to be calculated; and R is the scalar distance between the incremental current carrying member to the point where the magnetic field is being measured.

The current density $\vec{\lambda}$ determines the conductor path on each of the surfaces.

$$\vec{\lambda} = \lambda_\phi(\hat{\phi}) + \lambda_\rho \hat{\rho} + \lambda_z \hat{k} \qquad (2)$$

$$\lambda_\phi = c\sigma_\phi \cos\phi_0 \qquad (3)$$

$$\lambda_\rho = c\sigma_\rho \sin\phi_0 \qquad (4)$$

$$\lambda_z = c\sigma_z \sin\phi_0 \qquad (5)$$

The quantity c determines the overall strength of the surface current. The quantities $\sigma_\phi$, $\sigma_\rho$ and $\sigma_z$ determine the shape of the current path and the properties of the resultant gradient field, such as its linearity. $\sigma_\phi$ is a measure of the number of windings per unit surface length. $\sigma_\phi$ may also vary across the length of the surface which the windings are disposed. In the simplest case $\sigma_\phi$ may be a constant. The quantities $\sigma_\phi$, $\sigma_\rho$ and $\sigma_z$ can vary with the surface coordinates, $\rho$ and $z$ but not with $\phi$. They are related to one another by the continuity equation:

$$\nabla \cdot \vec{\lambda} = \frac{1}{\rho_0} \frac{\partial \lambda_\phi}{\partial \phi_0} + \frac{1}{\rho_0} \frac{\partial (\rho_0 \lambda_\rho)}{\partial \rho_0} + \frac{\partial \lambda_z}{\partial z_0} = 0 \qquad (6)$$

For an idealized transverse gradient coil, the magnetic fields produced by an inner cylinder of radius $a_1$ is:

$$B_1 = G_1^x x = \frac{\mu_0 c \sigma_\phi^{(1)}}{2a_1} \qquad (7)$$

where:

$\sigma_\phi^{(1)}$ is a function used to determine current density of the cylinder of radius $a_1$, x is distance across the coil, and $G_1^x$ is the transverse magnetic field gradient produced by the inner cylinder in the x direction (across the cylinder).

Similarly, the magnetic field produced by an idealized transverse gradient coil on an outer cylinder of radius $a_2$ is:

$$B_2 = G_2^x x = \frac{\mu_0 c \sigma_\phi^{(2)}}{2a_2} \qquad (8)$$

where:

$\sigma_\phi^{(2)}$ is a function used to determine current density on the cylinder of radius $a_2$, $G_2^x$ is the x transverse magnetic field gradient produced by the inner cylinder in the x direction.

Therefore the ratio of the magnetic fields gradients produced is:

$$\frac{B_2}{B_1} = \frac{G_2^x}{G_1^x} = \frac{\sigma_\phi^{(2)} a_1}{\sigma_\phi^{(1)} a_2} \qquad (9)$$

Therefore, the magnetic field strength is reduced by the effect of shielding. In addition, the return loop current, running in a different direction at the same radius, subtracts from the desired gradient magnetic field.

Since it is not necessary to include the return current path on the cylinder of radius $a_1$, and it has a smaller effect when at a larger distance, the return current path can be disposed on a surface a greater distance from the imaging volume, and have a smaller reducing effect on the magnetic field within the imaging volume. The return current may serve a second purpose, one of shielding to contain the stray magnetic fields without requiring a second full set of coils.

Figure 5:
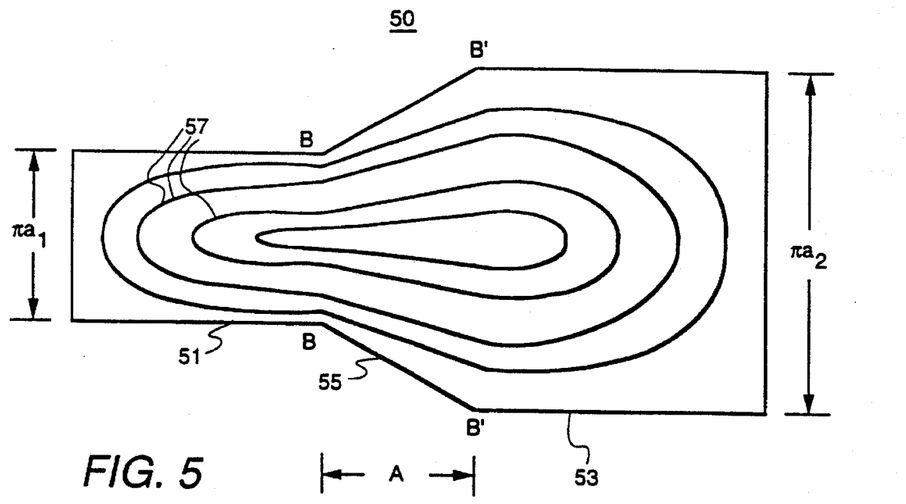
FIG. 5 is an illustration of a first embodiment of a transverse gradient coil design according to the present invention.
Figure 6:
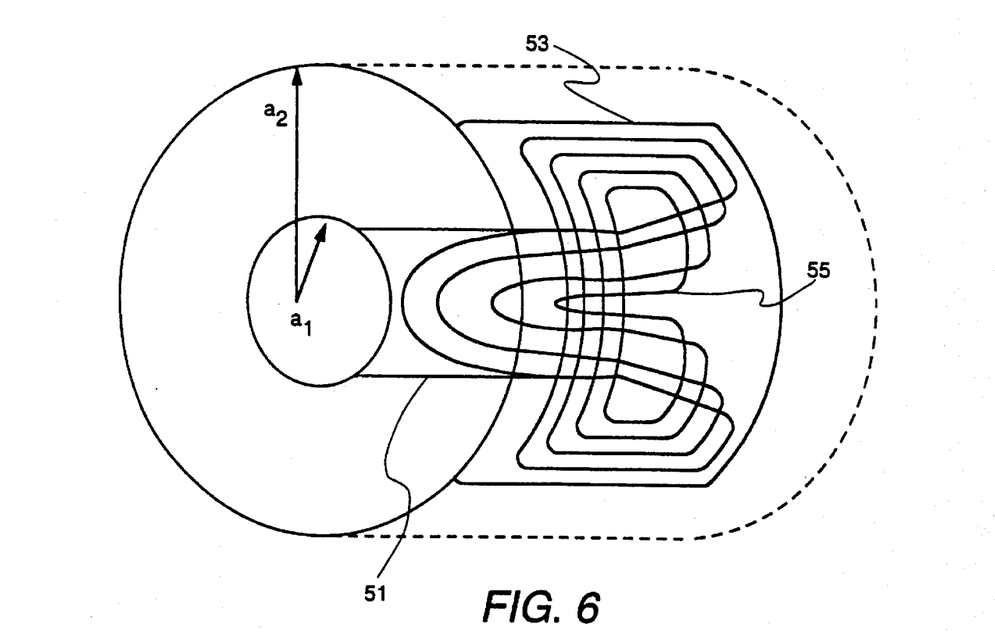
FIG. 6 is a perspective illustration of one embodiment of the coil of present invention disposed upon two cylinders of radii $a_1$, and $a_2$.

In FIG. 5, a single layer continuous gradient coil 50 is shown according to the present invention. It has a first region 51 having a plurality of half-loops 57 for carrying a current, a second region 53 having a plurality of half-loops 59 also for carrying a current, and a third region 55 having conductors which connect each half-loop 57 with a corresponding half-loop 50 to create a single coil 50. Coil 50 is intended to be folded or bent along the lines BB and B'B' to result in a shape which is disposed upon two cylinders of radii $a_1$, and $a_2$, as shown in FIG. 6. Section 51 is disposed upon a cylinder of radius $a_1$, while section 53 is disposed upon a cylinder of radius $a_2$. Section 55 is an intermediate used to link individual current paths of sections 51 and 53, connecting each turn of section 51 at radius $a_1$ to each corresponding turn of section 53 at radius $a_2$. This complication can be dealt with by appropriately soldering and supporting a connecting wire between each turn of coils at radius $a_1$ to those of radius $a_2$.

A pattern may be etched as indicated in FIG. 5, on a single plane then folded approximately along the lines BB and B'B'. However, unless $(a_2-a_1)/a_1 \ll 1$, a pattern such as in FIG. 5 cannot be folded and placed onto two cylindrical surfaces without buckling. It may be possible to design the region BB to B'B' using other than strictly linear patterns to permit sufficient puckering that the folding could be completed satisfactorily. Alternatively, it is possible to complete the region BB to B'B' with a discrete set of soldered jumper wires as mentioned above. In either case, these wires must be supported in a sufficiently strong fashion to withstand the forces caused by their interaction with the static magnetic field.

Section 53 serves two purposes—both to provide the necessary return current path, and to contain the fringing field. In order to accomplish these purposes most effectively, the two patterns will not be precise inverses of one another, but rather the outer path, section 53, may extend somewhat beyond the inner section 51 to effectively capture the flux at the ends.

Figure 7:
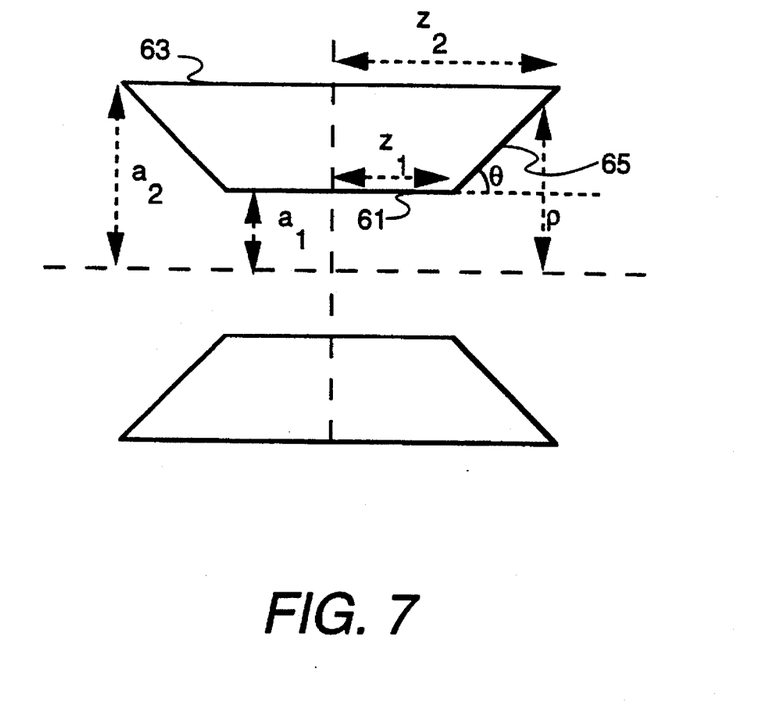
FIG. 7 is a elevational view of a gradient coil consistent with the present invention, used in connection with describing current flow.

FIG. 7 shows the geometry of the folded gradient coil. The surfaces 61, 65, 63 correspond to sections 51, 55, 53 of FIGS. 5 and 6, respectively. The lengths $z_1$ and $z_2$, the angle $\theta$ which the coil is bent and the cylinder dimensions are marked. $\phi$ designates an angle about the central axis of the cylinders. $\rho$ is a radial distance from the central axis. $\hat{\phi}$, $\hat{\rho}$, $\hat{k}$ are unit vectors in the directions of $\phi$, $\rho$ and the axis of the cylinders, respectively.

Since the dimensions and bending angle may be adjusted, relationships are set forth below for the current density for the coil to function properly.

Figure 8:
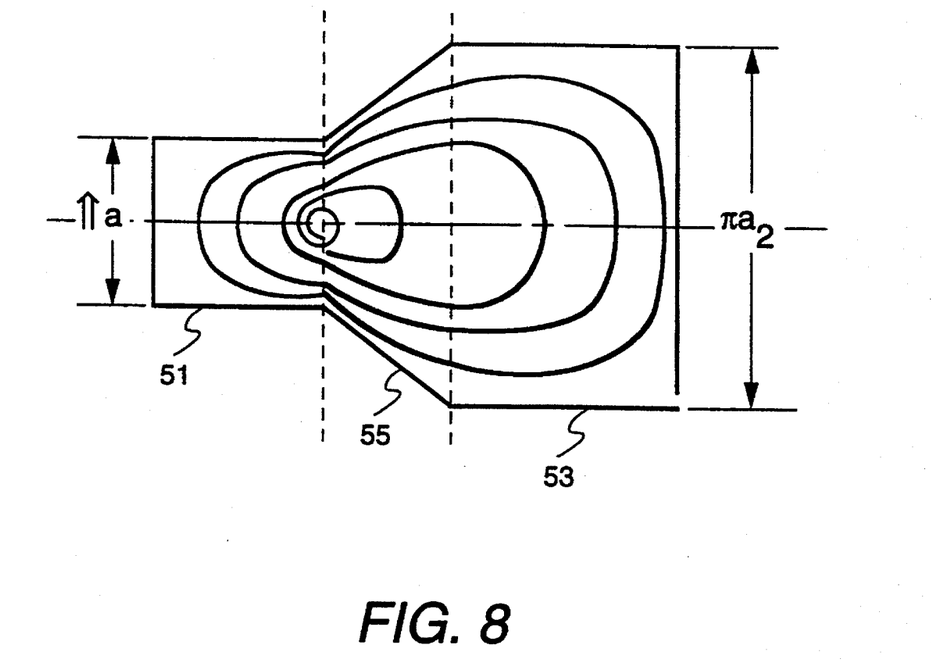
FIG. 8 is an illustration of a second embodiment of a transverse gradient coil design according to the present invention.

FIG. 8 illustrates a second embodiment of the gradient coil pattern compatible with the present invention. In this embodiment, some return current paths may only be disposed upon section 55, and not reach to section 53. Section 53 may have fewer return loops than section 51, provided however, that the current densities are consistent with the following equations. These define the functions to determine surface currents needed to produce a desired magnetic fields according to Eq. (1):

Surface 61:

$$\sigma_\phi = \sigma_\phi^A \qquad (10)$$

$$\sigma_z = \frac{z}{a_1} \sigma_\phi^A \qquad (11)$$

where $\sigma_\phi^A$ defines the number of windings per unit length of surface 61. In other instances $\sigma_\phi$ may vary according to z.

Surface 65:

$$\sigma_\phi = \sigma_\phi^B \qquad (12)$$

$$\sigma_s = \frac{z}{\rho} \sigma_\phi^A + \frac{\rho - a_1}{\rho \sin\theta} \sigma_\phi^B \qquad (13)$$

-continued $$\sigma_p = \sigma_s \sin\theta \quad (14)$$

$$\sigma_z = \sigma_s \cos\theta \quad (15)$$

where $\sigma_\phi{}^B$ defines the number of windings per unit length of surface 65. In other instances $\sigma_\phi$ vary along surface 65.

Surface 63:

$$\sigma_\phi{}^C = -\left(\frac{z_1}{z_2}\sigma_\phi{}^A + \frac{a_2-a_1}{z_2\sin\theta}\sigma_\phi{}^B\right) \quad (16)$$

$$\sigma_z{}^C = \frac{z}{a_2}\sigma_\phi{}^C \quad (17)$$

where $\sigma_\phi{}^C$ defines the number of windings per unit length of surface 63. In other instances $\sigma_\phi$ vary according to z.

Therefore, by choosing the dimensions $a_1$, $a_2$, $z_1$, $z_2$, and angle $\theta$, the current density $\lambda_\phi$, $\lambda_\rho$, $\lambda_z$ may be determined and conductor paths selected to produce these current densities required to produce the desired magnetic field. $\sigma_\phi{}^A$, $\sigma_\phi{}^B$ and $\sigma_\phi{}^A$ may be adjusted to trade off between reducing stray magnetic field flux, increasing linearity of the gradient field, reducing the energy required to switch the gradient field and so on.

The precise winding density can also be slightly adjusted, as conventionally done in shim coil designs, to achieve a higher degree of magnetic field linearity, if desired.

The present invention has several major advantages over conventional transverse gradient coil designs.

First, the total stored energy required to achieve a given gradient is greatly reduced over conventional designs. This reduces substantially the power supply requirements that are a crucial consideration in the practicality of the design.

Second, the tendency of the return current to reduce the effective magnetic field strength will be eliminated thereby extending the region of useful gradient along the z axis (length of the cylinder).

Third, the length of the tube which the gradient coils are disposed could be shorter reducing the claustrophobic effect which patients experience.

Fourth, the shorter gradient coil tube reduces the portion of the patient subjected to large magnetic field gradients, reducing the possibility of nerve stimulation effects which may occur in large magnetic field gradients.

And fifth, a shorter gradient coil tube reduces the ringing and noise associated with MR imaging.

While several presently preferred embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A coil for use in a magnetic field gradient system comprising:

a) a first surface comprised of a plurality of adjacent conductor half-loops each capable of carrying a current, the first surface partially enclosing an imaging volume;

b) a second surface comprised of a plurality of adjacent conductor half-loops each capable of carrying a current, the second surface arranged substantially parallel to the first surface, a distance away from the first surface, on a side of the first surface opposite that of the imaging volume with the conductors of the second surface substantially mirroring those of the first surface;

c) a plurality of connecting conductors, connecting each half-loop of the first surface to a corresponding half-loop of the second surface such that a continuous coil is produced from the half-loops such that current of corresponding conductors of the first and second surfaces would flow in opposite directions.

2. The coil of claim 1 wherein the half-loops of the second surface are larger than those of the first surface so as to shield fringe magnetic fields when activated.

3. The coil of claim 1 wherein the half-loops have an elliptical shape.

4. The coil of claim 1 wherein the half-loops, and conductors are disposed on a single element which is folded to produce a first, second surface and connecting conductors.

5. The coil of claim 1 wherein the conductors are formed to produce a surface current defined by:

$$\vec{\lambda} = \lambda_\phi \hat{\phi} + \lambda_\rho \hat{\rho} + \lambda_z \hat{k}$$

where $$\lambda_\phi = c\sigma_\phi \cos\phi$$

$$\lambda_\rho = c\sigma_\rho \sin\phi$$

$$\lambda_z = c\sigma_z \sin\phi$$

wherein the first surface has a partial cylindrical shape of radius $a_1$ and length $z_1$, and $\sigma_\phi$, $\sigma_\rho$, $\sigma_z$ for the half-loops of the first surface are defined by:

$\sigma_\phi = \sigma_\phi{}^A$, where $\sigma_\phi{}^A$ defines the number of windings per unit length of surface and may vary along the first surface, $$\sigma_z = \frac{z}{a_1}\sigma_\phi{}^A,$$

wherein the second surface has a partial cylindrical shape of radius $a_2$ and length $z_2$, and $\sigma_\phi$, $\sigma_\rho$, $\sigma_z$ for the half-loops of the second surface are defined by:

$$\sigma_\phi{}^C = -\left(\frac{z_1}{z_2}\sigma_\phi{}^A + \frac{a_2-a_1}{z_2\sin\theta}\sigma_\phi{}^B\right)$$

and $$\sigma_z{}^C = \frac{z}{a_2}\sigma_\phi{}^C,$$

wherein the connecting conductors make an angle $\theta$ with the first surface and $\sigma_\phi$, $\sigma_\rho$, $\sigma_z$ for the connecting conductors are defined by:

$\sigma_\phi = \sigma_\phi{}^B$, where $\sigma_\phi{}^A$ defines the number of windings per unit length of surface and may vary along the second surface, $$\sigma_s = \frac{z}{\rho}\sigma_\phi{}^A + \frac{\rho-a_1}{\rho\sin\theta}\sigma_\phi{}^B,$$

$\sigma_\rho = \sigma_s \sin\theta$, and $\sigma_z = \sigma_s \cos\theta$.

\* \* \* \* \*